United States Patent
Eleftheriou et al.

(10) Patent No.: US 9,531,406 B2
(45) Date of Patent: Dec. 27, 2016

(54) DECODING OF LDPC CODE

(75) Inventors: Evangelos S. Eleftheriou, Rueschlikon (CH); Robert Haas, Rueschlikon (CH); Xiao-Yu Hu, Rueschlikon (CH); Dung Nguyen, Tucson, AZ (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1063 days.

(21) Appl. No.: 14/358,609

(22) PCT Filed: May 25, 2011

(86) PCT No.: PCT/IB2011/052268
§ 371 (c)(1),
(2), (4) Date: Sep. 26, 2014

(87) PCT Pub. No.: WO2011/151759
PCT Pub. Date: Dec. 8, 2011

(65) Prior Publication Data
US 2015/0052413 A1 Feb. 19, 2015

(30) Foreign Application Priority Data
May 31, 2010 (EP) .................................... 10164532

(51) Int. Cl.
H03M 13/11 (2006.01)
H03M 13/29 (2006.01)

(52) U.S. Cl.
CPC ..... *H03M 13/1105* (2013.01); *H03M 13/1108* (2013.01); *H03M 13/2957* (2013.01)

(58) Field of Classification Search
CPC .......... H03M 13/1105; H03M 13/1108; H03M 13/2957

(Continued)

(56) References Cited

U.S. PATENT DOCUMENTS 7,904,793 B2 * 3/2011 Mokhlesi ............ G11C 11/5642
714/780
7,975,209 B2 * 7/2011 Chin .................... G06F 12/0246
375/262

(Continued)

FOREIGN PATENT DOCUMENTS

CN 101091321 12/2007
CN 101192834 6/2008

(Continued)

OTHER PUBLICATIONS

Itzhak Tamo and Moshe Schwartz: "Correcting Limited-Magnitude Errors in the Rank-Modulation Shceme", Ben Gourion University Online Repository, IEEE Transactions Theory, vol. 56, No. 6, Mar. 19, 2010 (Mar. 19, 2010), pp. 2551-2560, XP000002656582, Piscataway, NJ, USA.

(Continued)

*Primary Examiner* — John J Tabone, Jr.
(74) *Attorney, Agent, or Firm* — Yuanmin Cai, Esq.

(57) ABSTRACT

It is provided a method for decoding a sequence of bits encoded by a LPDC code. The method comprises providing a set of bit states, including a first state and a second state, and a set of conditions to change a bit state including a first condition 5 and a second condition. The first condition and the second condition are different. The method comprises reading the value of each bit of the sequence, associating each bit to a respective state of the set according to the values as read, determining that an evaluated condition is met and changing the state of the target bit as a result of the condition being met. The method may then set the value of the target bit of the 10 sequence according to the state thereof. Such a method provides a solution for decoding a sequence of bits encoded by a LDPC code with better (Continued)

performance than the classic bit-flipping algorithm with only a slight increase in complexity.

20 Claims, 5 Drawing Sheets

(58) Field of Classification Search
USPC .................................. 714/758, 752, 749, 794
See application file for complete search history.

(56) References Cited

U.S. PATENT DOCUMENTS

| 8,015,468 B2* | 9/2011 | Krouk | ................ | H03M 13/1108 714/749 |
| 2005/0190622 A1* | 9/2005 | Choi | ................... | G06F 13/1689 365/212 |
| 2006/0195765 A1* | 8/2006 | Coffey | .............. | H03M 13/1105 714/760 |
| 2008/0086670 A1* | 4/2008 | Krouk | ................ | H03M 13/1108 714/752 |
| 2009/0154236 A1 | 6/2009 | Kozlov | | |

FOREIGN PATENT DOCUMENTS

| CN | 101707485 | 5/2010 |
| WO | 2006073324 | 7/2006 |
| WO | 2010039866 | 4/2010 |

OTHER PUBLICATIONS

Marina, N., "LDPC codes for binary asymmetric channels", ICT 2008. International Conference on Telecommunications, Jun. 16, 2008 (Jun. 16, 2008), pp. 1-7, XP000002656585.

Miladinovic, N., et al., "Improved bit flipping decoding of low-density parity check codes", Proceedings of 2002 IEEE International Symposium on Information Theory. ISIT 02. Lausanne, Switzerland, Jun. 30-Jul. 5, 2002. [IEEE International Symposium on Information Theory], Jun. 30, 2002 (Jun. 30, 2002), pp. 229-229, XP010601940, DOI: 10.1109/ISIT. 2002.1023501. ISBN 978-0-7803-7501-7.

Kou, Y., et al., "Low-Density parity check codes based on finite geometries: A rediscovery and new results", IEEE Transactions on Information Theory, IEEE Press, USA, vol. 47, No. 7, Nov. 1, 2001 (Nov. 1, 2011), XP011028087, ISSN:0018-9448.

International Search Report dated Aug. 10, 2011 for International Application No. PCT/IB2011/052268.

Written Opinion dated Aug. 23, 2011 for International Application No. PCT/IB2011/052268.

Maeda, Y., et al., "Construction and Evaluation of Non-Binary LDPC Codes for Multilevel Cell Flash Memories", The Institute of Electronics, Information and Communication Engineers Information and Systems Society, Human Communication FIT2009 Forum on Information Technology. Aug. 20, 2009. pp. 1-8.

* cited by examiner

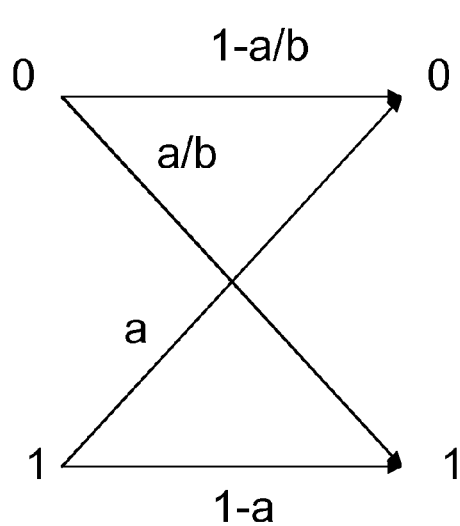
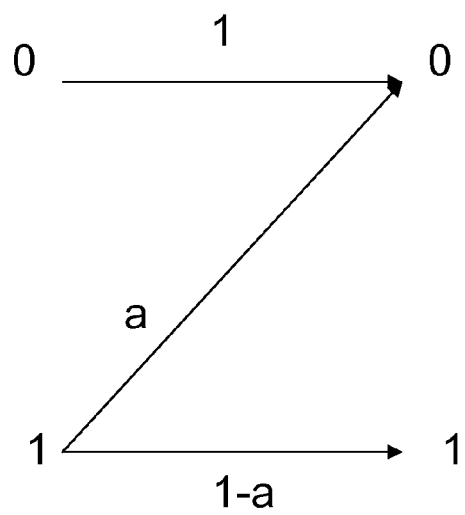
FIG.1                                    FIG.2

DECODING OF LDPC CODE

FIELD OF THE INVENTION

The invention relates to the field of computer science, in particular to the field of decoding low-density parity check code.

BACKGROUND OF THE INVENTION

Low-density parity-check (LDPC) codes, originally introduced by Gallager, and brought into prominence by MacKay and Meal, are powerful codes which allow a fast and robust retrieval of the information encoded with an acceptable level of redundancy. LDPC codes are thus widely used to store information on memories or to transmit information because the redundancy of information that they require and the time needed to correct the errors introduced in the information between writing and reading or between sending and receiving are not prohibitive.

In memory storage, a channel model, a term widely used in information and coding theory, is a model used to describe the error observed between encoded data as read and the encoded data intended to be written. A piece of data is said to follow a channel when errors are introduced to the data according to the model. Typically, when the piece of data includes a sequence of bits which is intended to be written on a memory and then read, the true value of each bit (i.e. the value of the bit intended to be written) may be modified during the writing, or during the storage, or even during the reading. Different channel models may be used depending on the application and the hypothesis made on the causes of the errors. Widely used channels include the additive white Gaussian channels (AWGN) and binary symmetric channels (BSC).

A single-level-cell (SLC) flash memory is a memory which consists of independent cells on which bits may be written. Each cell thus represents a single bit. The Flash cells are based on floating gate transistor technology. In other words, an electrical charge "trapped" on a transistor gate of the Flash cell determines the logic level (i.e. the value of the bit) as read on the Flash cell. Slightly simplified, the way that the Flash works can be described as follows: when "erasing" a cell, a charge is placed on the gate and the cell is read as logic one (i.e. the value of the bit is 1). "Programming (i.e. writing) a 0" on the cell is equivalent to discharging the gate, bringing the logic value to zero. It is only possible to program (respectively discharge) a cell that has been erased (respectively charged).

The Flash memory is arranged in pages and blocks with a page typically consisting of multiple flash cells (e.g. 4096 bytes for storing information bits and 128 bytes for storing redundant bits) and a block consisting of multiple pages (e.g. 64). Read and write operations usually operate on the page level while an erase operation is performed on an entire block. Since only the bits being written a 0 are discharged, the remaining bits are still charged. This means that, the actual wear caused to any specific cell/bit is proportional to the number of 0s ever being written on it. Typically the Flash cells have an endurance specification of 10,000 erase/write cycles, that is, each cell can be erased and written 10,000 times with 0s.

Because of the charge/discharge process inherent to flash read/write/erase operations, it can be realized that the error pattern most observed is an undesired transformation of a 1 to a 0. This can be modeled by the so-called binary asymmetric channel (BAC) shown on FIG. 1. With reference to FIG. 1, a written 1 may be read out as 1 with a probability 1−a and as 0 with an error probability a, while a stored 0 may be read out as 0 with a probability 1−a/b and as 1 with an error probability a/b, where a is a small number, ranging from $10^{-3}$ to $10^{-5}$, and b is a real number larger than 1, e.g. 10. Flash memories may sometimes be alternatively modeled by a Z-channel, as shown on FIG. 2, by neglecting the error pattern from 0 to 1, but this is a special case of the BAC when b goes to infinity.

Just like on other channel models, a sequence of bits encoded by LDPC code may be written on a flash memory. The following documents address LDPC coding for asymmetric channels:

"LDPC codes for binary asymmetric channels" by Marina, N., ICT 2008. International Conference on Telecommunications, 2008. 16-19 Jun. 2008 Page(s): 1-7;

"Does the Performance of LDPC Codes Depend on the Channel?" by Franceschini, M., Ferrari, G., Raheli, R., IEEE Transactions on Communications, Volume 54, Issue 12, December 2006 Page(s):2129-2132;

"Maximum Likelihood Decoding of Codes on the Z-channel" by Barbero, A.; Ellingsen, P.; Spinsante, S.; Ytrehus, O., IEEE International Conference on Communications, 2006, Volume 3, June 2006 Page(s):1200-1205; and "Density evolution for asymmetric memoryless channels" by Wang, C.-C.; Kulkarni, S. R., Poor, H. V., IEEE Transactions on Information Theory, Volume 51, Issue 12, December 2005 Page(s):4216-4236.

Practical decoding algorithms are used to decode information encoded in LDPC code. These include algorithms such as bit-flipping, Gallager A/B, belief propagation, and sum-product, which operate on long LDPC codes and have been demonstrated to offer exceptional error protection. Among these decoding algorithms, bit-flipping is the simplest one and is easy to implement.

An advantage of the bit-flipping algorithm is that the associated decoding complexity is significantly lower than other algorithms. The comparison to the sum-product algorithm, disclosed for example by the document by Feng Guo and Lajos Hanzol entitled "Reliability Ratio Based Weighted Bit-Flipping Decoding for LDPC codes", is briefly discussed. The sum-product algorithm requires 2jq number of additions and 7jq/log 2(q) multiplications per coded bit per iteration, where q is the size of the decoding field, which is two in this binary scenario. For a block length of 1000 bits and a maximum of 10 iterations, the required number of arithmetic operations was 200,000 additions and 700,000 multiplications. Besides, the bit-flipping algorithm does not require any additions and multiplications, which are expensive. The bit-flipping algorithm only requires logic operations by evaluating syndromes, which requires little digital logic and can be extremely fast.

The following documents deal with various versions of the bit flipping algorithm for iterative decoding of LDPC codes:

"An improvement on the modified weighted bit flipping decoding algorithm for LDPC codes" by Ming Jiang; Chunming Zhao; Zhihua Shi; Yu Chen, IEEE Communications Letters, Volume 9, Issue 9, September 2005 Page(s):814-816;

"On the Error Correction of Regular LDPC Codes Using the Flipping Algorithm" by Burshtein, D., IEEE Transactions on Information Theory, Volume 54, Issue 2, February 2008 Page(s):517-530;

"A Modification to Weighted Bit-Flipping Decoding Algorithm for LDPC Codes Based on Reliability Adjustment" by Dajun Qian; Ming Jiang; Chunming Zhao; Xiaofu Wu, IEEE International Conference on Communications, 2008. ICC'08, 19-23 May 2008 Page(s):1161-1165.

The following describes the bit flipping algorithm in its broad lines.

A binary (N, K) LDPC code with length N and dimension K is typically defined by a matrix H of parity checks. H has N columns and M rows with M>=N−K. Each column of H corresponds to an information bit or a parity bit and each row corresponds to a check sum. For any tentative bit decision vector b, the set of check sums or syndrome is the vector $s=bH^T$.

In the bit flipping algorithm, the decoder computes each parity check, using the binary input sequence b (i.e. read-out flash page) with simple XOR operations, namely $s=bH^T$. A parity check is satisfied if the corresponding bit in s is 0, and unsatisfied if it is 1. It then schedules a bit to be flipped if the number of unsatisfied checks involving that bit exceeds a fixed flipping threshold value t. The flipped bits are then used in the next iteration of the decoding process. The decoding algorithm stops when either all of the parity checks are satisfied or a pre-defined maximum iteration limit is reached. A pseudo-code for the resulting big-flipping algorithm may thus include the following steps:
  i. Compute the parity-checks using $s=bH^T$. If all of these parity checks are satisfied, then stop decoding.
  ii. Else, find the number of unsatisfied parity checks for each bit. Consider each of the bits in turn as a target.
  iii. If a majority of the parity check equations with a target bit are unsatisfied, then flip that bit prior to the next decoding iteration.
  iv. Repeat steps (i) to (iii).

The above algorithm provides satisfactory results for decoding LDPC code written on a binary symmetric channel. However, there is a need to provide a method that improves the decoding of LDPC code.

BRIEF SUMMARY OF THE INVENTION

According to a first aspect, the invention is embodied as a method for decoding a sequence of bits written on a memory following a binary asymmetric channel such as a flash memory, the sequence of bits being encoded by a low-density parity check code or LDPC code, whereby each bit of the sequence has corresponding parity checks defined by the LDPC code, the method comprising:
  providing a set of bit states including a first state and a second state and a set of conditions, wherein, when a condition is met, a bit state is to be changed, the set of conditions including a first condition to change a bit state from the first state to the second state and a second condition to change a bit state from the second state to the first state, wherein the first condition and the second condition are different,
  reading a value of each bit of the sequence of bits and associating each bit to a respective state of the set according to the value as read,
  for a target bit of the sequence of bits, evaluating a condition, wherein:
    the condition is selected from the set of conditions according to a state of the target bit, and
    evaluating the condition uses a result of computing the parity checks corresponding to the target bit,
  determining that the condition is met,
  changing the state of the target bit as a result of the condition being met, and
  setting the value of the target bit according to the state thereof.

In embodiments, the method may comprise one or more of the following features:
  the step of evaluating is iterated, the target bit being a different bit of the sequence at each iteration of the step of evaluating;
  the step of evaluating is iterated until the result of computing the parity checks indicates that all parity checks are satisfied or a maximum number of iteration is reached;
  the set of bit states consists of the first state and the second state, the set of conditions consists of the first condition and the second condition, at the step of associating each bit, a bit is associated to the first state if a value of the bit as read is 0, the second state if a value of the bit as read is 1, at the step of setting the value of the target bit, the value of the target bit is set to 0 if the target bit is associated to the first state, 1 if the target bit is associated to the second state;
  the first condition is met whenever a majority of the parity checks corresponding to the target bit are unsatisfied, whereas the second condition is met whenever all the parity checks corresponding to the target bit are unsatisfied;
  the first condition is met whenever a number of parity checks corresponding to the target bit which are unsatisfied is higher that a first threshold, whereas the second condition is met whenever a number of parity checks corresponding to the target bit which are unsatisfied is higher than a second threshold, the first threshold and the second threshold being different;
  the set of bit states further includes a third state and a fourth state, the set of conditions includes a first subset of pairs of conditions, wherein one condition of a pair is a condition to change a bit state from an i-th state to a j-th state, the other condition of the pair is a condition to change a bit state from the j-th state to the i-th state, the conditions of a pair are different, and the first condition and the second condition form a pair of the first subset, the set of conditions also includes a second subset of pairs of conditions, wherein one condition of a pair is a condition to change a bit state from a k-th state to a l-th state, the other condition of the pair is a condition to change a bit state from the l-th state to the k-th state, and the conditions of a pair of the second subset are the same;
  the set of conditions further includes a third subset comprising at least one condition to change a bit state from a m-th state to an n-th state for which there is no condition to change a bit state from the m-th state to the n-th state in the set of conditions;
  a condition is met whenever all of, or at least one but fewer than a majority of, or a majority of all the parity checks corresponding to the target bit are unsatisfied, or all the parity checks corresponding to the target bit are satisfied;
  the first bit state corresponds to a high confidence that the value of the bit intended to be written on the memory is 0, the second state corresponds to a low confidence that the value of the bit intended to be written on the memory is 0, the third state corresponds to a high confidence that the value of the bit intended to be written on the memory is 1, the fourth state corresponds to a low confidence that the value of the bit intended be written on the memory is 1, and the first subset of conditions comprises the first condition which is met when at least one but fewer than a majority of all the parity checks corresponding to the target bit are unsatisfied, the second condition which is met when all the parity checks corresponding to the target bit are unsatisfied, a third condition to change a bit from the third state to the fourth state, which is met when at least one but fewer than a majority of all the parity checks corresponding to the target bit are unsatisfied, a fourth condition to change a bit from the fourth state to the third state, which is met when all the parity checks corresponding to the target bit are unsatisfied, and the second subset of conditions comprises a fifth condition to change a bit state from the second state to the fourth state, which is met when a majority of all the parity checks corresponding to the target bit are unsatisfied, a sixth condition to change a bit state from the fourth state to the second state, which is met when a majority of all the parity checks corresponding to the target bit are unsatisfied, and the third subset of condition comprises a seventh condition to change a bit state from the first state to the fourth state, which is met when a majority of all the parity checks corresponding to the target bit are unsatisfied, an eighth condition to change a bit state from the third state to the second state, which is met when a majority of all the parity checks corresponding to the target bit are unsatisfied;

computing the parity checks corresponding to the target bit is performed according to values of bits of the sequence which are determined by corresponding bit states.

According to another aspect, the invention is embodied as a computer readable storage medium having recorded thereon a computer program comprising instructions for execution by a computer, the instructions comprising means for performing the above method.

According to a further aspect, the invention is embodied as a system comprising:

a memory suitable for writing a sequence of bits encoded by a LDPC code, and means for performing the above method.

In embodiments, the memory is a flash memory, preferably based on floating gate transistor technology.

Further features and advantages of the invention will appear from the following description of embodiments of the invention, given as non-limiting examples, with reference to the accompanying drawings listed hereunder.

BRIEF DESCRIPTION OF THE DRAWINGS

FIGS. 1-2 show examples of binary asymmetric channels.

DETAILED DESCRIPTION OF THE EMBODIMENTS

Figure 3:
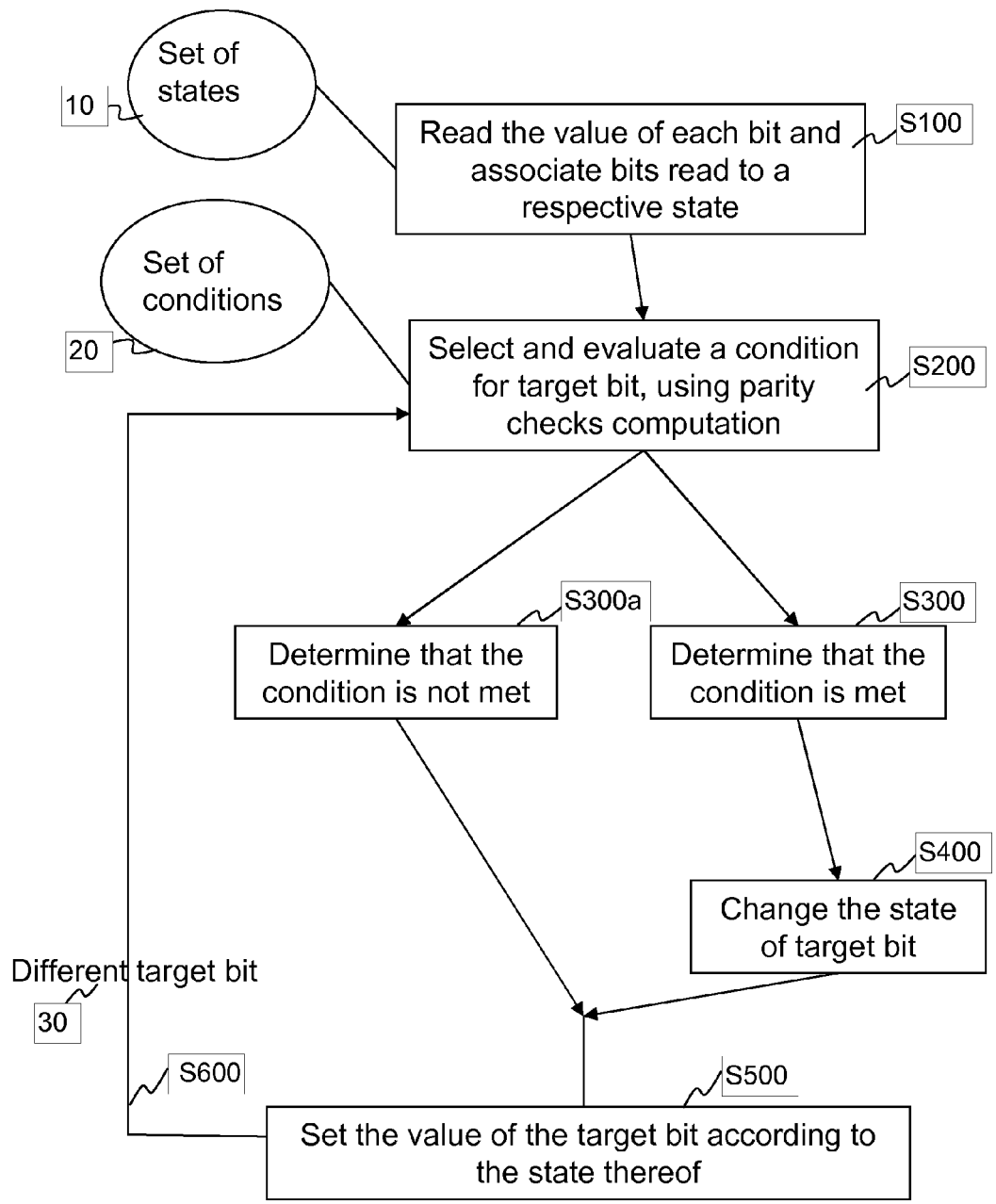
FIG. 3 shows a flowchart of an example of a method for decoding a bit sequence.

It is provided a computer-implemented method for decoding a sequence of bits written on a memory. The sequence of bits is encoded by a low-density parity check (or LDPC) code, whereby the bits of the sequence have corresponding parity checks, defined by the LDPC code. The method comprises providing a set of bit states, including a first state and a second state, and a set of conditions. When a condition is met, the state of a bit is to be changed. The set of conditions includes at least a first condition and a second condition. The first condition is to change a bit state from the first state to the second state. The second condition is to change a bit state from the second state to the first state. The first condition and the second condition are different. The method comprises reading the value of each bit of the written sequence of bits on the memory, and associating each bit to a respective state of the set according to the values as read. The method comprises evaluating a condition for a target bit of the sequence of bits. The condition to be evaluated is selected from the set of conditions according to the state of the target bit. The step of evaluating makes use of a result of computing the parity checks corresponding to the target bit. The method comprises steps of determining that the condition is met and changing the state of the target bit as a result of the condition being met. The method may then set the value of the target according to the state thereof. The method is preferably iterated for each bit of the sequence of bits read. Eventually, the value of each bit of the sequence is set according to its respective state. Such a method provides a solution for decoding a sequence of bits encoded by a LDPC code with better performance than the classic bit-flipping algorithm with only a slight increase in complexity.

By decoding a sequence of bits written on a memory, it is meant that the method gets as close as possible to the sequence of bits intended to be written. The decoding method may be part of a broader method which includes not only the decoding of the sequence of bits but also the interpretation of the sequence of bits after the decoding, for example by means of a dictionary associating bit sequences of the LDPC codes to words.

As the sequence of bits is encoded by a LDPC code, which means that the sequence of values of the sequence of bits intended to be written is a sequence authorized by the LDPC code, the bits of the sequence have corresponding parity checks defined by the LDPC code, as known per se from LDPC coding. In the following, the sequence is represented by $(b_1, \ldots, b_N)$. For at least some of the bits $b_i$ of the sequence, there are operations (i.e. parity checks) involving $b_i$ and other bits, for example J operations each involving k(j) other bits $(b_1^i, \ldots, b_{k(j)}^i)$, with j from 1 to J, for which there is an expected result. The operations are XOR operations which can be written as $b_i + b_1^i + \ldots + b_{k(j)}^i$ and are expected to be equal to 0. In the following, a parity check may refer to the result of the operation. A parity check is said to be satisfied when it is equal to the expected value and unsatisfied when it is equal to an unexpected value.

The method comprises providing a set of bit states, with at least two different states including a first state and a second state, and a set of conditions. When a condition is met, the state of a bit is to be changed. The set of conditions includes at least two conditions including a first condition and a second condition. The first condition is a condition to change a bit state from the first state to the second state. The second condition is a condition to change a bit state from the second state to the first state. The first condition and the second condition are different. A state is an intermediary variable used in the method and associated to a bit. The state of a bit is to be linked to the value of the bit and thus allows the retrieval of the value of the bit, as will be exemplified in the following. A condition is a prerequisite to change the state of a bit. When a condition is evaluated to be met (i.e. fulfilled), the state of a bit is to be changed from one state to another. For a bit $b_i$ of which state is $s_i$, the conditions may be Boolean functions depending on $b_i$ and/or $s_i$. When the result of the evaluation of the function is true (respectively false) then the condition is said (respectively not) to be met. In this case, the fact that the first condition and the second condition are different implies that at least two functions are such that they provide a different result for the same inputs.

The method comprises reading the value of each bit of the written sequence of bits on the memory and associating each bit to a respective state of the set according to the values as read. The value of a bit is defined in the traditional way: it is its logical level and it is equal to 1 or to 0. Examples of how to perform the associating are provided later.

The method comprises evaluating a condition selected from the set of conditions according to the state of a target bit $b_i^t$, the latter being one bit of the sequence, e.g., the first bit of the sequence. Performing the selection according to the state $s_i^t$ of the target bit ensures that conditions which are not to change the state $s_i^t$ to another state, i.e. conditions that are to change a state $s \ne s_i^t$ to another state, are not evaluated. This prevents evaluating unnecessary conditions and speeds up the method. In embodiments, the step of evaluating includes computing the parity checks corresponding to the target bit. Typically, computing the parity checks is performed after selection of a target bit, for which a condition is to be evaluated. Yet, computing the parity checks corresponding to all bits of the sequence can be in other embodiments performed before selecting a given target bit, i.e., based on current bit values as determined by the corresponding states of the bits involved. Thus, in general, the step of evaluating can be regarded as making use of a result of computing the parity checks corresponding (at least) to the target bit. In particular, comparisons involving the number of unsatisfied and/or satisfied parity checks may be made. For example, the number of unsatisfied parity checks and/or satisfied parity checks may be compared to a threshold. The evaluating allows this way that the decoding is performed fast.

When the condition is evaluated to be met the method changes the state of the target bit as a result of the condition being met. This ensures that the most appropriate state is associated to the target bit at the end of the method. The method may then set the value of the target bit, and possibly of each bit of the sequence according to the state of the respective bit. This step amounts to deciding the value of the bit as intended to be written, regardless of what is read. The possibility to change a bit and to associate the most appropriate state to the bits allows, when setting the value of each bit, (at least partly) the retrieval of the "correct" value of the bit.

The computing of the parity checks may be performed according to the state of the target bit and to the state of the other bits involved in the parity checks corresponding to the target bit. In the formula $b_i + b_1^i + \ldots + b_{k(j)}^i$ provided above for computing a parity check, the values $b_i, b_1^i, \ldots, b_{k(j)}^i$ used may be the values that are to be set for each bit according to the corresponding bit state. This is exemplified later.

As can be seen, no solving of complex equations needs to be done. Thus, as with the bit-flipping algorithm of the prior art, the method has low complexity and is particularly fast.

In the classic bit-flipping algorithm of the prior art, the value of a bit is flipped whenever the majority of parity checks corresponding to the target bit is unsatisfied. In other words, there is only one condition. In the present method, a set of conditions with at least two of them which are different is provided. Having different conditions allows e.g., for taking benefit from the asymmetry of the channel. Thus, the decision to flip a bit or not differs according to the current state of the bit. When repeated over the bits, the method ensures that the error rate observed at the end (the error rate being a representative of the difference between the sequence of bits outputted by the method after the step of setting the value of the target bit and/or other bits of the sequence and the sequence of bits intended to be written), is lower than with the classic bit-flipping algorithm. Thus, the method improves the bit-flipping algorithm (i.e. diminishes the error rate) with only a linear change in complexity.

As evoked above, the memory may follow a binary asymmetric channel. It may be for example a flash memory. In this case, with reference to FIGS. 1 and 2, the asymmetry of the method (i.e. the fact that two conditions of the set are different) particularly diminishes the error rate. The conditions may thus be adapted to the state of the bit. The idea is that, when a 1 is read, it means there is high chance that the bit as intended to be written was a 1. Indeed, the channel is such that the probability for a 0 to be transformed by mistake into a 1 is low. In the general case, it is better that the condition to change a 1 into a 0 be not the same as the condition to change a 0 to a 1. The set of conditions having two different conditions ensures that this is verified. In principle, bit flipping algorithms can be used on binary asymmetric channels (BAC) without modification, but it suffers significant performance degradation due to the special nature of BAC, in particular when b is relatively large as it is the case with flash memory.

In reference to FIG. 3, a flowchart is shown which illustrates an embodiment of the method. First, a set 10 of bit states is provided, which includes e.g., a first state and a second state. Also, a set 20 of conditions is provided. As said, a condition is designed such that when the condition is evaluated to be met, the state of a bit is to be changed. Conditions at least include:

a first condition, i.e., as to whether to change a bit state from the first state to the second state and a second condition, to change a bit state from the second state to the first state. The second condition yet differs from the first condition.

As illustrated, the value of each bit of the written sequence of bits is read. The corresponding bit is then associated to a respective state, according to the value of the bit as read, step S100.

Then, for a given target bit 30 of the sequence, a condition shall be evaluated, step S200. Note that:

the condition is selected from the set 20 of conditions, according to the state of the target bit; and evaluating the condition makes use a result of computing the parity checks corresponding to the target bit, as evoked earlier.

Note that all parity checks may be computed before a target bit 30 is selected. Conversely, the parity checks corresponding to the target bit may be computed after selection of the target bit, prior to evaluating the condition per se. This is discussed in more details below.

Next, if it is determined, step S300, that the selected condition is met, the state of the target bit is accordingly changed (step S400). Else, the state of the target bit is not changed, step S300a.

Finally, the value of the target bit can be set according to the respective state thereof, step S500.

Preferably, the process is iterated, as depicted in FIG. 3, step S600. The target bit 30 is then a different bit at each iteration, e.g., the next bit in the sequence, such as to process all bits in the sequence. Each iteration comprises evaluating a suitably selected condition, determining whether the condition is met and changing the state of the bit being currently processed, if necessary.

In an embodiment, each iteration requires computing the parity checks corresponding to the target bit. As said, computing the parity checks involves bit values which can be retrieved from the current states of bits of the sequence. Then, the value of the current target bit can be set according to its current state (as obtained upon completion of the iteration), if necessary. Such an embodiment corresponds to the flowchart of FIG. 3.

In a variant, parity checks are first computed according to current values of bits in the sequence, which are themselves determined by the corresponding states. Then, all bits of the sequence can be processed iteratively, i.e., each iteration comprises evaluating a suitably selected condition, determining whether the condition is met and changing the state of the bit being currently processed, if necessary. Eventually, upon completion of the bit iteration, the value of each bit of the sequence is set according to the current state of each bit. This has the advantages that parity checks need not be recomputed for each bit in the bit iteration, which saves time.

In all cases, the evaluation step makes use of a result of computing the parity checks corresponding to the target bit.

In embodiments, the process is further iterated until all parity checks are satisfied, i.e., as indicated by the result of the parity check computation. In variants, the process is iterated until a maximum number of iterations is reached, for ensuring a convergence.

Accordingly, the iteration ensures that most of the bits of the sequence are associated to the most appropriate state in the end. Thus, at the step of setting the values of the bits, the values set are likely the most accurate.

In the following, two embodiments of the method are discussed with reference to FIGS. 4 and 5, which exemplify actual implementation of respective sets of bit states and conditions.

Figures 4, 5:
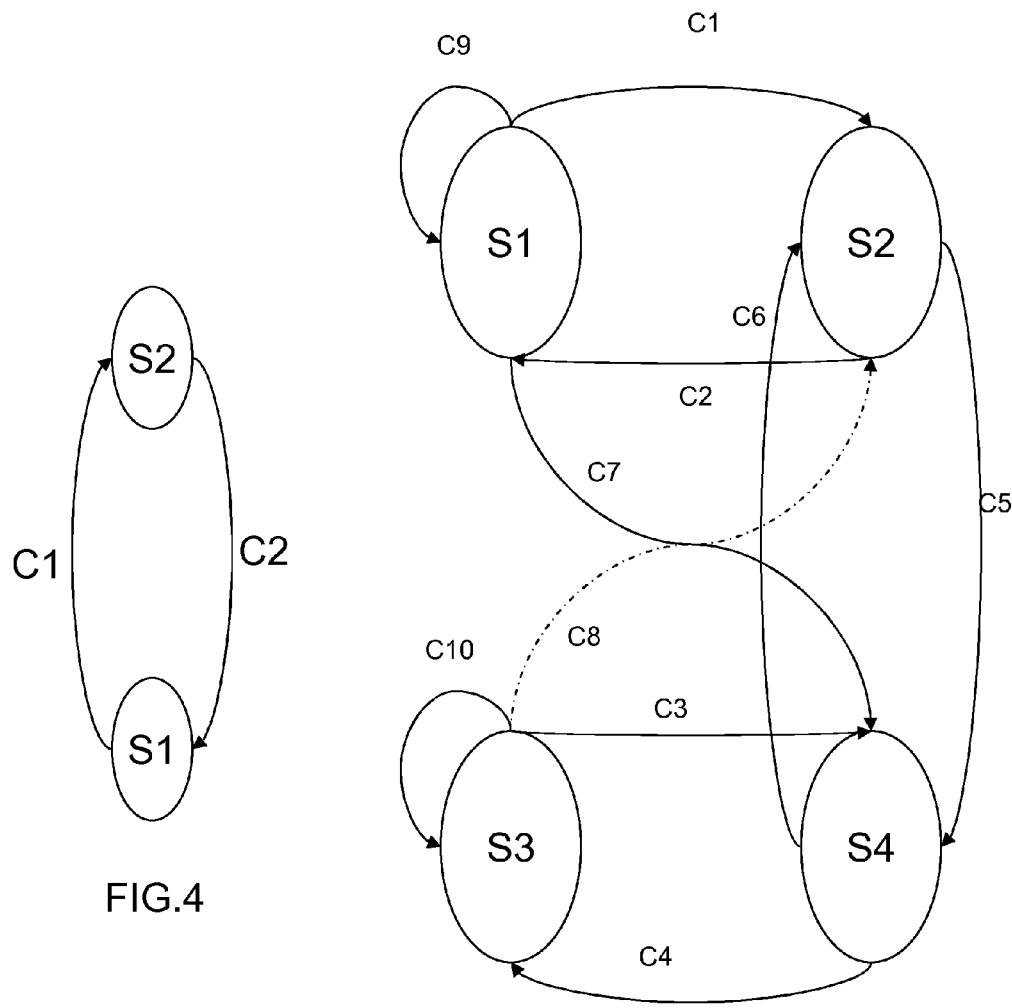
FIGS. 4-5 show a representation of sets of states and conditions of two examples of a method for decoding a bit sequence.

In the example of FIG. 4 (also referred to as "Modified bit flipping algorithm"), the set of states consists of the first state S1 and the second state S2. In other words, there are only two bit states here. This allows a bijective correspondence between a state and a value of a bit, assuming the bits have binary values, e.g., 1 or 0 (this is what is considered in the following). For example, S1 corresponds to 0 and S2 corresponds to 1. The set of conditions consists of the first condition C1 and the second condition C2. When associating each bit to a respective state, a bit is associated to the first state S1 if the value of the bit as read is 0, and a bit is associated to the second state S2 if the value of the bit as read is 1. As described above two conditions are relied upon. The first condition C1 is to change a bit state from S1 to S2, the second condition C2 is to change a bit state from S2 to S1. Yet, the first condition and the second condition differ, e.g., such as to take benefit from the asymmetry of the channel. Upon completion of the evaluation process, the value of the target bit is set to 0 if the state of the target bit is the first state S1 and the value of the target bit is set to 1 if the state of the target bit is the second state S2. Such a method of decoding has a particularly low complexity. Thus, in this example, the states S1 and S2 are intermediary variables and there is a perfect correspondence between bit values and states.

More in details, the first condition C1 may be met whenever the majority of the parity checks corresponding to the target bit are unsatisfied, or whenever the number of parity checks corresponding to the target bit which are unsatisfied is higher than a first threshold $t_1$. The second condition C2 may be met whenever all the parity checks corresponding to the target bit are unsatisfied, or whenever the number of parity checks corresponding to the target bit which are unsatisfied is higher than a second threshold $t_2$. If used, the first threshold $t_1$ and the second threshold $t_2$ are different. Typically, because S1 corresponds to 0 and S2 corresponds to 1, $t_1 < t_2$. Alternatively, proportions may be used for the comparisons. Many other suitable conditions can be contemplated within the scope of the above method. In general, a condition may also be met whenever all of, or at least one but fewer than a majority of, or a majority of all the parity checks corresponding to the target bit are unsatisfied, or all the parity checks corresponding to the target bit are satisfied. Other kinds of conditions are discussed in reference to the second example. The conditions applying to any of the two examples may apply to the other example as well. The values of the thresholds may depend on the values a and b of the channel. This ensures the adaptation of the method depending on the memory on which it is performed.

The second example of performing the method (also referred to as "2 bit—Bit flipping algorithm") is discussed with reference to FIG. 5. As exemplified in FIG. 5, the set of bit states may further include a third state S3 and a fourth state S4. The set of conditions may for instance include a first subset of pairs of conditions such as {(C1, C2), (C3, C4)}. Formally, one condition (C1 or C3) of a pair (C1, C2) or (C3, C4) is a condition to change a bit state from an i-th state to a j-th state. The other condition (C2 or C4) of the pair is a condition to change a bit state from the j-th state to the i-th state. Here, the conditions of a pair are different; the first condition C1 and the second condition C2 form a pair (C1, C2) of the first subset {(C1, C2), (C3, C4)}. The i-th state may be S1 or S3 and the j-th state respectively S2 or S4.

In the example of FIG. 5, the set of conditions also includes a second subset of pairs of conditions such as {(C5, C6)}, wherein one condition C5 of the pair {(C5, C6)} is a condition to change a bit state from a k-th state (e.g. S2) to a l-th state (e.g. S4), the other condition C6 being a condition to change a bit state from the l-th state to the k-th state. At variance with the first subset of pairs of conditions, here the conditions are the same. In the case of FIG. 5, the second subset has only one pair (C5, C6). Parameters k and l may thus take the values 5 or 6 in this case. Yet, the second subset may have more than one pair in general, for example if there are more than four states. Such a method refines the transitions between states by introducing intermediary states. The first subset introduces asymmetry between different states. The combination of asymmetry and intermediary states allows the reach of a final result which is closer to the sequence intended to be written.

The set of conditions may further include a third subset such as {(C7, C8)} comprising at least one condition C7 or C8 to change a bit state from an m-th state (e.g. S1 or S3) to an n-th state (e.g. S4 or S2 respectively). Note that there is no counterpart condition in this case, i.e., to change a bit state from the m-th state to the n-th state. This introduces further asymmetry to the method and further improves the accuracy in practice.

As it is the case in table I below and FIG. 6, the first bit state S1 may correspond to a high confidence that the value of the bit intended to be written on the memory is 0. The second state S2 may correspond to a low confidence that the value of the bit intended to be written on the memory is 0. The third state S3 may correspond to a high confidence that the value of the bit intended to be written on the memory is 1. The second state may correspond to a low confidence that the value of the bit intended to be written on the memory is 1. In such a case, when associating each bit to a respective state of the set, a bit may be associated to state S1 or S2 if its value as read is 0, and to S3 or S4 if its value as read is 1. At the step of setting the value of each bit of the sequence, the value may be set to 0 if the state of the bit is S1 or S2 and to 1 if the state is S3 or S4. As in the example of FIG. 4, there may thus be a correspondence between the states and the two values 0 or 1 a bit can take (this shall be the case in general).

This correspondence may be further used in the formula $b_i + b_1^i + \ldots + b_{k(j)}^i$ provided above for computing a parity check. Indeed, the values used may be 0 if the state of the bit $b_i$, $b_1^i$, ..., $b_{k(j)}^i$ is S1 or S2 and 1 if the state of the bit $b_i$, $b_1^i$, ..., $b_{k(j)}^i$ is S3 or S4. As shown in this second example and in the first example, computing the parity checks corresponding to the target bit may thus, in the general case, be performed according to values of bits of the sequence which are e.g., determined by corresponding bit states.

In the second example of the method, the set of states may consist in four states in which case, the bit states may be implemented by two-bit logic for every state, incurring an overhead compared to the first example.

It should be noted that the second example of the method may be used for other channel models such as binary symmetric channels (BSC) by modifying the set of conditions accordingly.

Table I below provides an extensive set of conditions and corresponding set of states for a specific example. Again, implementing such sets of states and conditions has a relatively low complexity and achieves good results in practice.

TABLE I extensive set of conditions and corresponding set of states, in an embodiment.

| Condition # | Changes... | To... | Condition contents |
|---|---|---|---|
| C9 | S1 | S1 | If all associated parity checks satisfied |
| C1 | S1 | S2 | If at least one associated parity checks unsatisfied and the number of unsatisfied checks less than majority |
| C2 | S2 | S1 | If all associated parity checks satisfied |
| C7 | S1 | S4 | If a majority of all associated parity checks unsatisfied |
| C8 | S3 | S2 | If a majority of all associated parity checks unsatisfied |
| C10 | S3 | S3 | If all associated parity checks satisfied |
| C3 | S3 | S4 | If at least one associated parity checks unsatisfied and the number of unsatisfied checks less than majority |
| C4 | S4 | S3 | If all associated parity checks satisfied |
| C5 | S4 | S2 | If a majority of all associated parity checks unsatisfied |
| C6 | S2 | S4 | If a majority of all associated parity checks unsatisfied |

Figure 6:
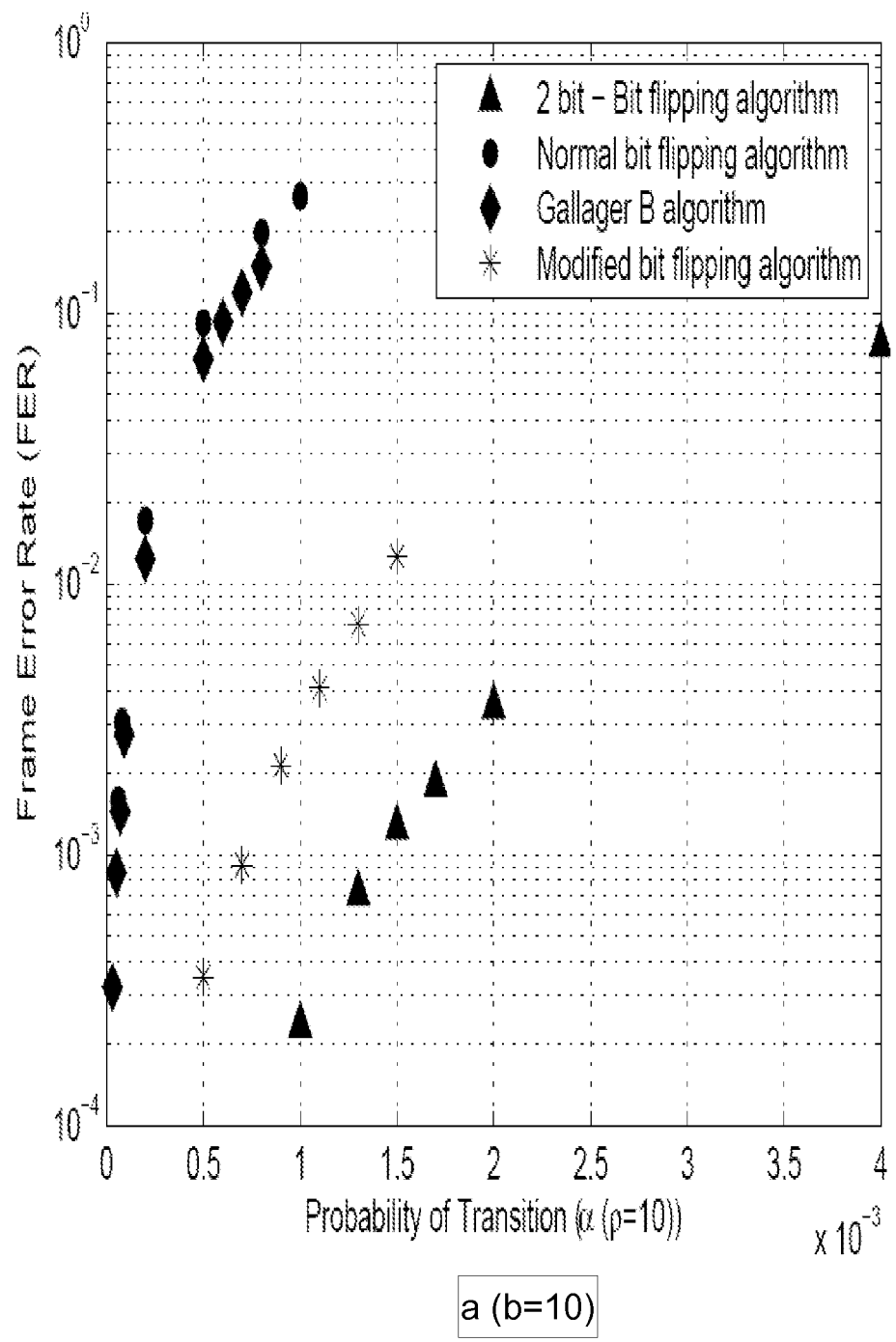
FIG. 6 shows results of simulations of methods for decoding a bit sequence.

FIG. 6 shows simulation results for a random regular LDPC code. The code length is 1908, the column weight is 4 and the rate is 0.8889. The results provide the frame error rate versus the probability of transition a using four different decoding methods. The value of a is the one used in the binary asymmetric channel of FIG. 1 and b equals to 10. The frame error rate is the global error remaining after performing a decoding method. In other words, it is the difference between the bit sequence outputted by a decoding method and the bit sequence intended to be written. Two decoding methods are the prior art Gallager B algorithm and the Normal bit flipping algorithm, which were presented earlier. One of the two other decoding methods is the "modified bit flipping algorithm", corresponding to the first example, wherein $t_1$ and $t_2$ are chosen according to a and b. The other one of the two other methods is the "2 bit —Bit flipping algorithm", corresponding to Table I.

As can be seen from the results, for all values of a for which simulations are provided, both the "2 bit—Bit flipping algorithm" and the "modified bit flipping algorithm" provide improved decoding compared to prior art algorithms, as the final frame error rate is each time inferior.

A computer program may comprise instructions for execution by a computerized system, the instructions comprising means for performing part or all of the above method. Such a computer program may be recorded on a computer readable storage medium, for example a CD, a hard disk, or a flash memory.

A system may comprise a memory suitable for writing a sequence of bits encoded by a LDPC code and means suitably interfaced to the memory for performing the above decoding method. The memory may be a flash memory, preferably based on floating gate transistor technology. Such a system is particularly robust for the storage of data. Indeed, thanks to the means for performing the decoding method, retrieval of modified/lost data is both fast and accurate.

It is to be understood that the present invention may be embodied as a system, method or computer program product. In particular, the invention may be embodied as a computer-implemented method. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Any of the foregoing may be supplemented by, or incorporated in, specially designed ASICs (application-specific integrated circuits). In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Figure 7:
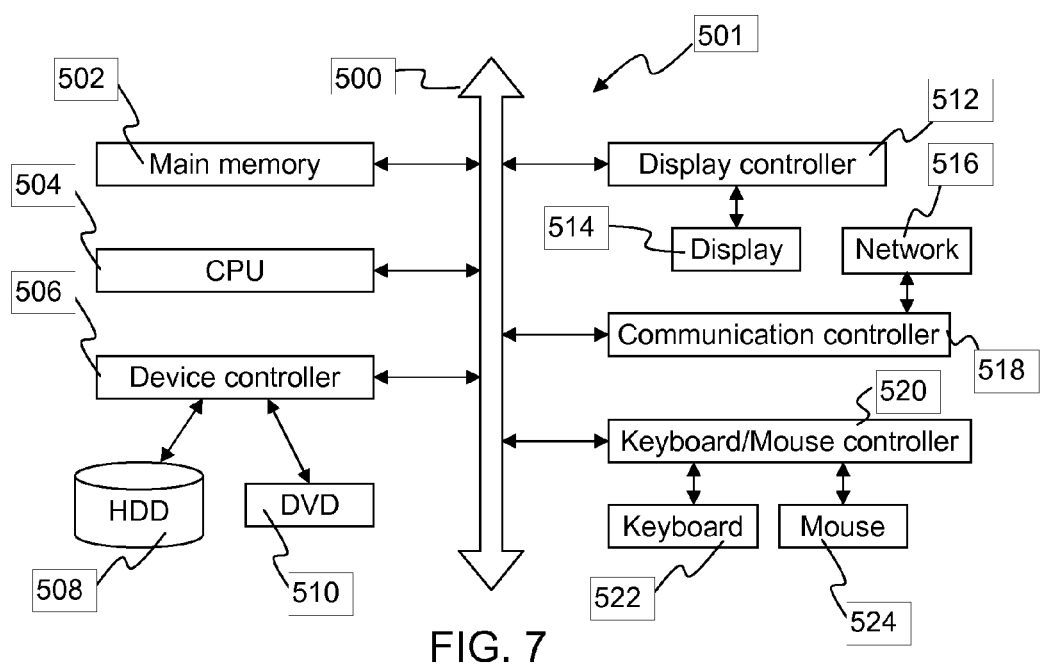
FIG. 7 is a block diagram of computer hardware according to an embodiment of the present invention.

FIG. 7 is a block diagram of computer hardware according to an embodiment of the invention. A computer system (501) according to an embodiment of the invention included a CPU (504) and a main memory (502), which are connected to a bus (500).

The bus (500) is connected to a display controller (512) which is connected to a display (514) such as an LCD monitor. The display (514) is used to display information about a computer system. The bus (500) is also connected to a storage device such hard disk (508) or DVD (510) through a device controller (506) such as an IDE or SATA controller. The bus (500) is further connected to a keyboard (522) and a mouse (524) through a keyboard/mouse controller (520) or a USB controller (not shown). The bus is also connected to a communication controller (518) conforms to, for example, an Ethernet protocol. The communication controller (518) is used to physically connect the computer system (501) with a network (516).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or at least triggered by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer implemented method for decoding a sequence of bits written on a memory following a binary asymmetric channel, the sequence of bits being encoded by a low-density parity check (LDPC) code, whereby each bit of the sequence of bits has corresponding parity checks defined by the LDPC code, the method comprising:

providing a set of bit states including a first bit state and a second bit state and a set of conditions, each bit state corresponding to a logical value for the bit and each condition corresponding to an evaluation of the LDPC code, wherein, when a condition is met, a bit state is changed, the set of conditions including a first condition to change the bit state from the first bit state to the second bit state and a second condition to change the bit state from the second bit state to the first bit state, wherein the first condition and the second condition are different, such that they provide a different result for the same input, using a computer processor, reading a value of each bit of the sequence of bits and associating each bit to a respective state of the set of bit states according to the value as read, for a target bit of the sequence of bits, evaluating the condition of the target bit, using the computer processor, wherein:

the condition is selected from the set of conditions according to the state of the target bit, and evaluating the condition uses a result of computing the parity checks corresponding to the target bit according to the LDPC code, determining that the condition is met, using the computer processor, the condition being met being based on satisfying a number of the parity checks, changing the state of the target bit as a result of the condition being met, using the computer processor, and setting the value of the target bit according to the state thereof, using the computer processor.

2. The method of claim 1, wherein the step of evaluating is iterated, the target bit being a different bit of the sequence of bits at each iteration of the step of evaluating.

3. The method of claim 2, wherein the step of evaluating is iterated until the result of computing the parity checks indicates that all parity checks are satisfied or a maximum number of iterations is reached.

4. The method of claim 2, wherein:
the set of bit states consists of the first bit state and the second bit state,
the set of conditions consists of the first condition and the second condition,
at the step of associating each bit to a respective bit state of the set of bit states according to the value as read, the bit is associated to:
the first bit state if the value of the bit as read is 0,
the second bit state if the value of the bit as read is 1,
at the step of setting the value of the target bit, the value of the target bit is set to:
0 if the target bit is associated to the first bit state,
1 if the target bit is associated to the second bit state.

5. The method of claim 2, wherein:
the set of bit states further includes a third state and a fourth state,
the set of conditions includes a first subset of pairs of conditions, wherein:
one condition of a first pair of conditions is a condition to change the bit state from an i-th state to a j-th state,
the other condition of the first pair of conditions is the condition to change the bit state from the j-th state to the i-th state, the conditions of the first pair of conditions are different, such that they provide a different result for the same input, and
the first condition and the second condition form a pair of the first subset of pairs of conditions, the set of conditions also includes a second subset of pairs of conditions, wherein:
one condition of a second pair of conditions is a condition to change the bit state from a k-th state to a l-th state,
the other condition of the second pair of conditions is a condition to change the bit state from the l-th state to the k-th state, and
the conditions of the pair of conditions of the second subset of pairs of conditions are the same.

6. The method of claim 3, wherein:
the set of bit states consists of the first bit state and the second bit state,
the set of conditions consists of the first condition and the second condition, at the step of associating each bit to a respective bit state of the set of bit states according to the value as read, a bit is associated to:
the first bit state if the value of the bit as read is 0,
the second bit state if the value of the bit as read is 1, at the step of setting the value of the target bit, the value of the target bit is set to:
0 if the target bit is associated to the first bit state,
1 if the target bit is associated to the second bit state.

7. The method of claim 3, wherein:
the set of bit states further includes a third state and a fourth state,
the set of conditions includes a first subset of pairs of conditions, wherein:
one condition of a pair of conditions is a condition to change the bit state from an i-th state to a j-th state,
the other condition of the pair of conditions is a condition to change the bit state from the j-th state to the i-th state, the conditions of pair of conditions are different, such that they provide a different result for the same input, and
the first condition and the second condition form a pair of conditions of the first subset of pairs of conditions, the set of conditions also includes a second subset of pairs of conditions, wherein:
one condition of a pair of conditions is a condition to change the bit state from a k-th state to a l-th state,
the other condition of the pair of conditions is a condition to change the bit state from the l-th state to the k-th state, and
the conditions of the pair of conditions of the second subset of pairs of conditions are the same.

8. The method of claim 1, wherein:
the set of bit states consists of the first bit state and the second bit state,
the set of conditions consists of the first condition and the second condition,
at the step of associating each bit to a respective bit state of the set of bit states according to the value as read, the bit is associated to:
the first bit state if the value of the bit as read is 0,
the second bit state if the value of the bit as read is 1,
at the step of setting the value of the target bit, the value of the target bit is set to:
0 if the target bit is associated to the first bit state,
1 if the target bit is associated to the second bit state.

9. The method of claim 8, wherein the first condition is met whenever a majority of the parity checks corresponding to the target bit are unsatisfied, whereas the second condition is met whenever all the parity checks corresponding to the target bit are unsatisfied.

10. The method of claim 8, wherein the first condition is met whenever a number of parity checks corresponding to the target bit which are unsatisfied is higher than a first threshold, whereas the second condition is met whenever a number of parity checks corresponding to the target bit which are unsatisfied is higher than a second threshold, the first threshold and the second threshold being different.

11. The method of claim 8, wherein:
the set of bit states consists of the first bit state and the second bit state,
the set of conditions consists of the first condition and the second condition, at the step of associating each bit to a respective bit state of the set of bit states according to the value as read, a bit is associated to:
the first bit state if the value of the bit as read is 0,
the second bit state if the value of the bit as read is 1, at the step of setting the value of the target bit, the value of the target bit is set to:
0 if the target bit is associated to the first bit state,
1 if the target bit is associated to the second bit state.

12. The method of claim 8, wherein:
the set of bit states further includes a third state and a fourth state, the set of conditions includes a first subset of pairs of conditions, wherein:
one condition of a pair of conditions is a condition to change a bit state from an i-th state to a j-th state,
the other condition of the pair of conditions is a condition to change the bit state from the j-th state to the i-th state, the conditions of the pair of conditions are different, such that they provide a different result for the same input, and
the first condition and the second condition form a pair of the first subset of pairs of conditions,
the set of conditions also includes a second subset of pairs of conditions, wherein:
one condition of a pair of conditions is a condition to change a bit state from a k-th state to a l-th state,
the other condition of the pair of conditions is a condition to change the bit state from the l-th state to the k-th state, and
the conditions of the pair of conditions of the second subset of pairs of conditions are the same.

13. The method of claim 1, wherein:
the set of bit states further includes a third bit state and a fourth bit state,
the set of conditions includes a first subset of pairs of conditions, wherein:
one condition of a first pair of conditions is a condition to change the bit state from an i-th state to a j-th state,
the other condition of the first pair of conditions is a condition to change the bit state from the j-th state to the i-th state,
the conditions of each pair of conditions are different, such that they provide a different result for the same input, and
the first condition and the second condition form a pair of the first subset of pairs of conditions,
the set of conditions also includes a second subset of pairs of conditions, wherein:
one condition of a second pair of conditions is a condition to change the bit state from a k-th state to a l-th state,
the other condition of the second pair of conditions is a condition to change the bit state from the l-th state to the k-th state, and
the conditions of a pair of the second subset of pairs of conditions are the same.

14. The method of claim 13 wherein the set of conditions further includes a third subset of pairs of conditions comprising at least one condition to change a bit state from a m-th state to an n-th state for which there is no condition to change a bit state from the m-th state to the n-th state in the set of conditions.

15. The method of claim 14, wherein a condition is met whenever all of, or at least one but fewer than a majority of, or a majority of all the parity checks corresponding to the target bit are unsatisfied, or all the parity checks corresponding to the target bit are satisfied.

16. The method of claim 14, wherein:
the first bit state corresponds to a high confidence that the value of the bit intended to be written on the memory is 0,
the second bit state corresponds to a low confidence that the value of the bit intended to be written on the memory is 0,
the third bit state corresponds to a high confidence that the value of the bit intended to be written on the memory is 1,
the fourth bit state corresponds to a low confidence that the value of the bit intended to be written on the memory is 1,
and the first subset of pairs of conditions comprises:
the first condition which is met when at least one but fewer than a majority of all the parity checks corresponding to the target bit are unsatisfied,
the second condition which is met when all the parity checks corresponding to the target bit are unsatisfied,
a third condition to change the bit from the third bit state to the fourth bit state, which is met when at least one but fewer than a majority of all the parity checks corresponding to the target bit are unsatisfied,
a fourth condition to change the bit from the fourth bit state to the third bit state, which is met when all the parity checks corresponding to the target bit are unsatisfied,
and the second subset of pairs of conditions comprises:
a fifth condition to change the bit state from the second bit state to the fourth bit state, which is met when a majority of all the parity checks corresponding to the target bit are unsatisfied,
a sixth condition to change the bit state from the fourth bit state to the second bit state, which is met when a majority of all the parity checks corresponding to the target bit are unsatisfied,
and the third subset of pairs of condition comprises:
a seventh condition to change the bit state from the first bit state to the fourth bit state, which is met when a majority of all the parity checks corresponding to the target bit are unsatisfied,
an eighth condition to change the bit state from the third bit state to the second bit state, which is met when a majority of all the parity checks corresponding to the target bit are unsatisfied.

17. The method of claim 1, wherein computing the parity checks corresponding to the target bit is performed, using the computer processor, according to values of bits of the sequence of bits, which are determined by corresponding bit states.

18. A non-transitory computer readable storage medium having recorded thereon a computer program comprising instructions for execution by a computer to decode a sequence of bits written on a memory following a binary asymmetric channel, the sequence of bits being encoded by a low-density parity check (LDPC) code, whereby each bit of the sequence of bits has corresponding parity checks defined by the LDPC code, the instructions for performing:
providing a set of bit states including a first state and a second state and a set of conditions, each bit state corresponding to a logical value for the bit and each condition corresponding to an evaluation of the LDPC code, wherein, when a condition is met, a bit state is changed, the set of conditions including a first condition to change the bit state from the first state to the second state and a second condition to change the bit state from the second state to the first state, wherein the first condition and the second condition are different, such that they provide a different result for the same input,
reading a value of each bit of the sequence of bits and associating each bit to a respective state of the set of bit states according to the value as read,
for a target bit of the sequence of bits, evaluating the condition of the target bit, wherein:
the condition is selected from the set of conditions according to the state of the target bit, and evaluating the condition uses a result of computing the parity checks corresponding to the target bit according to the LDPC code,
determining that the condition is met, the condition being met being based on satisfying a number of the parity checks,
changing the state of the target bit as a result of the condition being met, and
setting the value of the target bit according to the state thereof.

19. A system comprising:
a memory suitable for writing a sequence of bits encoded by a low-density parity check (LDPC) code; and
a processor communicatively coupled to the memory, where the processor is configured to perform providing a set of bit states including a first state and a second state and a set of conditions, each bit state corresponding to a logical value for the bit and each condition corresponding to an evaluation of the LDPC code, wherein, when a condition is met, a bit state is changed, the set of conditions including a first condition to change the bit state from the first state to the second state and a second condition to change the bit state from the second state to the first state, wherein the first condition and the second condition are different, such that they provide a different result for the same input,
reading a value of each bit of the sequence of bits and associating each bit to a respective state of the set of bit states according to the value as read,
for a target bit of the sequence of bits, evaluating the condition of the target bit, wherein:
the condition is selected from the set of conditions according to the state of the target bit, and
evaluating the condition uses a result of computing the parity checks corresponding to the target bit according to the LDPC code,
determining that the condition is met, the condition being met being based on satisfying a number of the parity checks,
changing the state of the target bit as a result of the condition being met, and
setting the value of the target bit according to the state thereof.

20. The system according to claim 19, wherein the memory is a flash memory, and is based on floating gate transistor technology.

* * * * *